US006221118B1

(12) United States Patent
Yoshida et al.

(10) Patent No.: US 6,221,118 B1
(45) Date of Patent: Apr. 24, 2001

(54) CERIUM OXIDE ABRASIVE AND METHOD OF POLISHING SUBSTRATES

(75) Inventors: Masato Yoshida, Tsukuba; Toranosuke Ashizawa, Hitachinaka; Hiroki Terazaki, Tsukuba; Yasushi Kurata, Tsukuba; Jun Matsuzawa, Tsukuba; Kiyohito Tanno; Yuuto Ootuki, both of Hitachi, all of (JP)

(73) Assignee: Hitachi Chemical Company, Ltd. (JP)

( * ) Notice: Subject to any disclaimer, the term of this patent is extended or adjusted under 35 U.S.C. 154(b) by 0 days.

(21) Appl. No.: 09/269,650

(22) PCT Filed: Sep. 30, 1997

(86) PCT No.: PCT/JP97/03490

§ 371 Date: Aug. 10, 1999

§ 102(e) Date: Aug. 10, 1999

(87) PCT Pub. No.: WO98/14987

PCT Pub. Date: Apr. 9, 1998

(30) Foreign Application Priority Data

| Sep. 30, 1996 | (JP) | 8-258766 |
| Sep. 30, 1996 | (JP) | 8-258767 |
| Sep. 30, 1996 | (JP) | 8-258768 |
| Sep. 30, 1996 | (JP) | 8-258770 |
| Sep. 30, 1996 | (JP) | 8-258774 |
| Sep. 30, 1996 | (JP) | 8-258775 |
| Sep. 30, 1996 | (JP) | 8-258776 |
| Sep. 30, 1996 | (JP) | 8-258781 |
| Jan. 28, 1997 | (JP) | 9-014371 |
| Apr. 30, 1997 | (JP) | 9-112396 |
| Aug. 1, 1997 | (JP) | 9-207866 |

(51) Int. Cl.[7] .............. C09K 3/14; C09G 1/02
(52) U.S. Cl. .............. 51/309; 51/307; 106/3
(58) Field of Search .............. 51/307, 309; 106/3; 438/692, 693; 510/175, 397

(56) References Cited

U.S. PATENT DOCUMENTS

| 5,011,671 | * | 4/1991 | Le Loarer | 423/592 |
| 5,389,352 | * | 2/1995 | Wang | 106/3 |
| 5,543,126 | * | 8/1996 | Ota et al. | 423/263 |
| 5,697,992 | * | 12/1997 | Ueda et al. | 51/307 |
| 5,766,279 | * | 6/1998 | Ueda et al. | 51/309 |
| 5,876,490 | * | 3/1999 | Ronay | 106/3 |

FOREIGN PATENT DOCUMENTS

| 0 820 092 | 1/1998 | (EP) . |
| 2 583 034 | 12/1986 | (FR) . |
| 8-134435 | 5/1996 | (JP) . |

* cited by examiner

*Primary Examiner*—Michael Marcheschi
(74) *Attorney, Agent, or Firm*—Pennie & Edmonds LLP

(57) ABSTRACT

This invention provides a cerium oxide abrasive with which the surfaces of substrates such as $SiO_2$ insulating films can be polished at a high rate without causing scratches. The abrasive of the present invention comprises a slurry comprising cerium oxide particles whose primary particles have a diameter of from 10 nm to 600 nm and a median diameter of from 30 nm to 250 nm and slurry particles have a median diameter of from 150 nm to 600 nm and a maximum diameter of 3,000 nm or smaller, the cerium oxide particles being dispersed in a medium.

1 Claim, No Drawings

CERIUM OXIDE ABRASIVE AND METHOD OF POLISHING SUBSTRATES

TECHNICAL FIELD

This invention relates to a cerium oxide abrasive and a method of polishing substrates.

BACKGROUND ART

In semiconductor device fabrication processes, colloidal silica type abrasives have commonly been studied as chemomechanical abrasives for smoothing inorganic insulating film layers such as $SiO_2$ insulating films formed by a process such as plasma-assisted CVD (chemical vapor deposition) or low-pressure CVD. Colloidal silica type abrasives are produced by growing silica particles into grains by, e.g., thermal decomposition of silicon tetrachloride, followed by pH-adjustment with an alkali solution containing non alkali metal, such as aqueous ammonia. Such abrasives, however, have a technical problem of a low polishing rate which prevents them being put into practical use, because the inorganic insulating films can not be polished at a sufficiently high polishing rate.

Meanwhile, cerium oxide abrasives are used in glass-surface polishing for photomasks. The cerium oxide abrasives are useful for finish mirror polishing because they have a hardness lower than silica particles and alumina particles and hence the polishing surface is very difficult to scratch. Also, cerium oxide has a chemically active nature and is known as a strong oxidizing agent. Making the most of this advantage, it is useful to apply the cerium oxide in chemomechanical abrasives for insulating films. However, if the cerium oxide abrasives used in glass-surface polishing for photomasks are used in the polishing of inorganic insulating films as they are, they have so large a primary particle diameter that the insulating film surface may come to have polish scratches which are visually perceivable.

DISCLOSURE OF THE INVENTION

The present invention provides a cerium oxide abrasive that can polish the surfaces of objects such as $SiO_2$ insulating films without causing scratches and at a high rate, and also provides a method of polishing substrates.

The cerium oxide abrasive of the present invention comprises a slurry comprising cerium oxide particles whose primary particles have a median diameter of from 30 nm to 250 nm and slurry particles have a median diameter of from 150 nm to 600 nm; the cerium oxide particles being dispersed in a medium.

The cerium oxide abrasive of the present invention may also comprise a slurry made up of cerium oxide particles whose primary particles have a median diameter of from 100 nm to 250 nm and slurry particles have a median diameter of from 150 nm to 350 nm; the cerium oxide particles being dispersed in a medium.

In the above cerium oxide particles, the primary particles may preferably have a maximum diameter of 600 nm or smaller and a primary-particle diameter of from 10 nm to 600 nm.

The cerium oxide abrasive of the present invention may still further comprise a slurry made up of cerium oxide particles whose primary particles have a median diameter of from 30 nm to 70 nm and slurry particles have a median diameter of from 250 nm to 600 nm; the cerium oxide particles being dispersed in a medium.

The above cerium oxide particles may preferably have a primary-particle diameter of from 10 nm to 100 nm.

In the cerium oxide abrasive of the present invention, the cerium oxide particles may preferably have a maximum particle diameter of 3,000 nm or smaller.

Water may be used as the medium, and at least one dispersant selected from a water-soluble organic high polymer, a water-soluble anionic surface-active agent, a water-soluble nonionic surface-active agent and a water-soluble amine may be used, of which ammonium polyacrylate is preferred.

As the cerium oxide particles, cerium oxide obtained by firing cerium carbonate may preferably be used.

The cerium oxide abrasive of the present invention can polish a given substrate for semiconductor chips or the like, on which silica films have been formed.

BEST MODES FOR PRACTICING THE INVENTION

The cerium oxide is commonly obtained by firing a cerium compound such as cerium carbonate, cerium sulfate or cerium oxalate. $SiO_2$ insulating films formed by TEOS-CVD, for example, can be polished at a higher rate as abrasives have a larger primary-particle diameter and a lower crystal strain, i.e., have better crystallinity, but tend to be prone to polish scratches. Accordingly, the cerium oxide particles used in the present invention are produced without making their crystallinity so high. Also, since the abrasive may be used to polish semiconductor chips, its content of alkali metals and halogens may preferably be controlled to be 1 ppm or less.

The abrasive of the present invention has a high purity, and does not contain more than 1 ppm of Na, K, Si, Mg, Ca, Zr, Ti, Ni, Cr and Fe each and more than 10 ppm of Al.

In the present invention, firing may be employed as a process for producing the cerium oxide particles. In particular, low-temperature firing is preferred, which can make the crystallinity as low as possible in order to produce particles that do not cause polish scratches. Since the cerium compounds have an oxidation temperature of 300° C., they may preferably be fired at a temperature of from 600° C. to 900° C.

The cerium carbonate may preferably be fired at a temperature of from 600° C. to 900° C. for 5 to 300 minutes in an oxidative atmosphere of oxygen gas or the like.

The cerium oxide obtained by firing may be pulverized by dry-process pulverization such as jet milling or by wet-process pulverization such as bead milling. The jet milling is described in, e.g., KAGAKU KOGYO RONBUNSHU (Chemical Industry Papers), Vol. 6, No. 5 (1980), pages 527–532. Cerium oxide obtained by firing was pulverized by dry-process pulverization such as jet milling, whereupon a pulverization residue was seen to occur.

The slurry of cerium oxide in the present invention is obtained by dispersion-treating an aqueous solution containing cerium oxide particles produced in the manner described above or a composition comprising cerium oxide particles collected from this aqueous solution, water and optionally a dispersant. Here, the cerium oxide particles may preferably be used in a concentration ranging, but not particularly limited to, from 0.1 to 10% by weight in view of readiness to handle suspensions. As the dispersing agent, it may include, as those containing no metal ions, water-soluble organic high polymers such as acrylic polymers and ammonium salts thereof, methacrylic polymers and ammonium salts thereof, and polyvinyl alcohol, water-soluble anionic surface-active agents such as ammonium lauryl sulfate and ammonium polyoxyethylene lauryl ether sulfate, water-soluble nonionic surface-active agents such as polyoxyethylene lauryl ether and polyethylene glycol monostearate, and water-soluble amines such as monoethanolamine and diethanolamine.

Ammonium polyacrylate, in particular, ammonium polyacrylate having weight-average molecular weight of from 5,000 to 20,000 is preferred. Any of these dispersing agents may preferably be added in an amount ranging from 0.01 part by weight to 5 parts by weight based on 100 parts by weight of the cerium oxide particles in view of the dispersibility and anti-sedimentation properties of particles in the slurry. In order to improve its dispersion effect, the dispersing agent may preferably be put in a dispersion machine simultaneously with the particles at the time of dispersion treatment.

These cerium oxide particles may be dispersed in water by dispersion treatment using a conventional agitator, and besides by using a homogenizer, an ultrasonic dispersion machine or a ball mill. Particularly for dispersing the cerium oxide particles as fine particles of 1 μm or smaller, it is preferable to use wet-process dispersion machines such as a ball mill, a vibration ball mill, a satellite ball mill and a media agitating mill. In a case where the slurry should be made more highly alkaline, an alkaline substance containing no metal ions, such as aqueous ammonia, may be added during the dispersion treatment or after the treatment.

The cerium oxide abrasive of the present invention may be used as it is in the form of the above slurry. It may also be used as an abrasive to which an additive such as N,N-diethylethanolamine, N,N-dimethylethanolamine or aminoethylethanolamine has been added.

Primary particles constituting the cerium oxide particles dispersed in the slurry of the present invention have a median diameter of from 30 to 250 nm and their particles standing dispersed (slurry particles) have a median diameter of from 150 to 600 nm.

If the primary particles have a median diameter smaller than 30 nm or the particles standing dispersed have a median diameter smaller than 150 nm, the surfaces of objects to be polished such as $SiO_2$ insulating films can not be polished at a high rate. If the primary particles have a median diameter larger than 250 nm or the slurry particles have a median diameter larger than 600 nm, scratches may occur on the surfaces of objects to be polished such as $SiO_2$ insulating films.

Cerium oxide particles whose primary particles have a median diameter of from 100 nm to 250 nm and slurry particles having a median diameter of from 150 nm to 350 nm are preferred. If their respective median diameters are smaller than the above lower-limit values, a low polishing rate may result and, if they are larger than the above upper-limit values, scratches tend to occur.

In the above cerium oxide particles, the primary particles may preferably have a maximum diameter not larger than 600 nm, and may preferably have a primary-particle diameter of from 10 to 600 nm. The primary particles having a particle diameter larger than the upper-limit value 600 nm may result in occurrence of scratches and those having a particle diameter smaller than 10 nm may result in a low polishing rate.

Cerium oxide particles whose primary particles have a median diameter of from 30 nm to 70 nm and slurry particles having a median diameter of from 250 nm to 600 nm are also preferred. If their respective median diameters are smaller than the above lower-limit values, a low polishing rate may result and, if they are larger than the above upper-limit values, scratches tend to occur.

In the above cerium oxide particles, the primary particles may preferably have a diameter of from 10 to 100 nm. If the primary particles have a particle diameter smaller than 10 nm, a low polishing rate may result. If they have a particle diameter larger than the upper-limit value 100 nm, scratches tend to occur.

In the cerium oxide abrasive of the present invention, the cerium oxide particles may preferably have a maximum diameter not larger than 3,000 nm. If the cerium oxide particles have a maximum diameter larger than 3,000 nm, scratches tend to occur.

The cerium oxide particles obtained by pulverizing fired cerium oxide by dry-process pulverization such as jet milling contains a pulverization residue. Such pulverization residue particles differ from agglomerates of primary particles having re-agglomerated, and are presumed to be broken by stress at the time of polishing to generate active surfaces, which are considered to contribute to the polishing of the surfaces of objects to be polished, such as $SiO_2$ insulating films, at a high rate without causing scratches.

The slurry of the present invention may contain pulverization residue particles having a particle diameter of 3,000 nm or smaller.

In the present invention, the primary-particle diameter is measured by observing the particles on a scanning electron microscope (e.g., Model S-900, manufactured by Hitachi, Ltd.). The particle diameter of the cerium oxide particles as slurry particles is measured by laser diffraction (using, e.g., MASTER SIZER MICROPLUS, manufactured by Malvern Instruments Ltd.; refractive index: 1.9285; light source: He—Ne laser; absorption: 0).

The primary particles constituting the cerium oxide particles dispersed in the slurry of the present invention may preferably have an aspect ratio of from 1 to 2 and a median value of 1.3. The aspect ratio is measured by observing the particles on a scanning electron microscope (e.g., Model S-900, manufactured by Hitachi Ltd.).

As the cerium oxide particles to be dispersed in the slurry of the present invention, cerium oxide particles whose structural parameter Y which represents an isotropic microstrain in analysis by the powder X-ray Rietvelt method (RIETAN-94) has a value of from 0.01 to 0.70 may be used. The use of cerium oxide particles having such a crystal strain makes it possible to carry out polishing without scratching the surfaces of objects and also at a high rate.

The cerium oxide particles dispersed in the slurry of the present invention may preferably have a specific surface area of from 7 to 45 $m^2/g$. Those having a specific surface area smaller than 7 $m^2/g$ tend to make scratches on the surfaces of polish objects, and those having a specific surface area larger than 45 $m^2/g$ tend to result in a low polishing rate. The specific surface area of the cerium oxide particles of the slurry is identical with the specific surface area of cerium oxide particles to be dispersed.

The cerium oxide particles in the slurry of the present invention may preferably have a zeta potential of from −100 mV to −10 mV. This brings about an improvement in dispersibility of the cerium oxide particles and makes it possible to carry out polishing without scratching the surfaces of polish objects and also at a high rate.

The cerium oxide particles dispersed in the slurry of the present invention may have an average particle diameter of from 200 nm to 400 nm and a particle size distribution half width of 300 nm or smaller.

The slurry of the present invention may preferably have a pH of from 7 to 10, and more preferably from 8 to 9.

After the slurry has been prepared, it may be put in a container of polyethylene or the like and left at 5 to 55° C. for 7 days or more, and more preferably 30 days or more, so that the slurry may cause less scratches.

The slurry of the present invention has such good dispersion and such a low rate of sedimentation that its rate of change in concentration after 2-hour leaving is less than 10% at every height and every position of a column of 10 cm in diameter and 1 m in height.

The inorganic insulating films on which the cerium oxide abrasive of the present invention is used may be formed by a process including low-pressure CVD and plasma-assisted CVD. The formation of $SiO_2$ insulating films by low-pressure CVD makes use of monosilane $SiH_4$ as an Si source and oxygen $O_2$ as an oxygen source. Oxidation reaction of this $SiH_4$—$O_2$ system to obtain the inorganic insulating film may be carried out at a low temperature of about 400° C. or below. When phosphorus (P) is doped in order to make the surface smooth by high-temperature reflowing, it is preferable to use a reaction gas of $SiH_4$—$O_2$—$PH_3$ system. The plasma-assisted CVD has an advantage that any chemical reaction which requires a high temperature under normal heat equilibrium can be carried out at a low temperature. Plasma may be generated by a process including two types of coupling, namely capacitive coupling and inductive coupling. Reaction gas may include gases of $SiH_4$—$N_2O$ system making use of $SiH_4$ as an Si source and $N_2O$ as an oxygen source and gases of TEOS-$O_2$ system making use of tetraethoxysilane (TEOS) as an Si source (i.e., TEOS plasma-assisted CVD method). Substrate temperature may preferably be within the range of from 250° C. to 400° C., and reaction pressure from 67 Pa to 400 Pa. Thus, the $SiO_2$ insulating films in the present invention may be doped with an element such as phosphorus or boron.

As the given substrate, substrates may be used which are obtained by forming $SiO_2$ insulating films on semiconductor substrates, i.e., semiconductor substrates such as a semiconductor substrate at the stage where circuit elements and wiring patterns have been formed thereon or a substrate at the stage where circuit elements have been formed thereon. The $SiO_2$ insulating film formed on such a semiconductor substrate is polished with the cerium oxide abrasive described above, whereby any unevenness on the $SiO_2$ insulating film surface can be removed to provide a smooth surface over the whole area of the semiconductor substrate. Here, as a polishing apparatus, commonly available polishing apparatus may be used, having i) a holder for holding a semiconductor substrate and ii) a platen (provided with a motor whose number of revolution is variable) on which a polishing cloth (a pad) is stuck. As the polishing cloth, commonly available nonwoven fabric, foamed polyurethane or porous fluorine resin may be used, and there are no particular limitations. The polishing cloth may also preferably be processed to provide grooves where the slurry may gather. There are no particular limitations on polishing conditions, and preferably the platen may be rotated at a small number of revolution of 100 rpm or below so that the semiconductor substrate may not run out. Pressure applied to the semiconductor substrate may preferably be 1 kg/cm or below so that the substrate does not get scratched as a result of polishing. In the course of polishing, the slurry is fed continuously to the polishing cloth by means of a pump or the like. There are no particular limitations on the feed rate of this slurry. It is preferable for the surface of the polishing cloth to always be covered with the slurry.

Semiconductor substrates on which the polishing has been completed may preferably be well rinsed in running water and thereafter water drops adhering to the surfaces of semiconductor substrates are brushed off by means of a spin dryer or the like, followed by drying. On the $SiO_2$ insulating film having been thus smoothed, second-layer aluminum wiring is formed. An $SiO_2$ insulating film is again formed between the wiring and on the wiring, followed by polishing with the cerium oxide abrasive described above, whereby any unevenness on the insulating film surface is removed to provide a smooth surface over the whole area of the semiconductor substrate. This process may be repeated a given number of times so that a semiconductor having the desired number of layers can be produced.

The cerium oxide abrasive of the present invention may be used to polish not only the $SiO_2$ insulating films formed on semiconductor substrates, but also $SiO_2$ insulating films formed on wiring boards having given wiring, glass, inorganic insulating films such as silicon nitride film, optical glass such as photomasks, lenses and prisms, inorganic conductive films such as ITO (indium tin oxide) film, optical integrated circuits, optical switching devices or optical waveguides which are constituted of glass and a crystalline material, optical fiber end faces, optical single crystals such as scintillators, solid-state laser single crystals, blue-laser LED (light-emitting diode) sapphire substrates, semiconductor single crystals such as SiC, GaP and GaAs, magnetic disk glass substrates, magnetic heads and so forth.

Thus, in the present invention, what is referred to as the given substrate includes semiconductor substrates on which $SiO_2$ insulating films have been formed, wiring boards on which $SiO_2$ insulating films have been formed, glass, inorganic insulating films such as silicon nitride film, optical glasses such as photomasks, lenses and prisms, inorganic conductive films such as ITO film, optical integrated circuits, optical switching devices or optical waveguides which are constituted of glass and a crystalline material, optical fiber end faces, optical single crystals such as scintillators, solid-state laser single crystals, blue-laser LED sapphire substrates, semiconductor single crystals such as SiC, GaP and GaAs, magnetic disk glass substrates, and magnetic heads.

The slurry prepared by dispersing the cerium oxide particles in the medium reacts chemically with part of an insulating film layer provided on the given substrate to form a reactive layer, and the reactive layer is removed mechanically with the cerium oxide particles, thus making it possible to polish the insulating film layer at a high rate and also without causing any polish scratches.

Cerium oxide abrasives are used in glass-surface polishing for photomasks. The cerium oxide abrasives are useful for finish mirror polishing because they have a lower hardness than silica particles and alumina particles and hence the polishing surface is unlikely to be scratched. Also, cerium oxide has a chemically active nature and is known as a strong oxidizing agent. Making the most of this advantage, it is useful for the cerium oxide to be applied in chemomechanical abrasives for insulating films. However, if the cerium oxide abrasives used in glass-surface polishing for photomasks are used in the polishing of insulating films as they are, the particles have such high crystallinity that the insulating film surface may be subject to polish scratches which are visually perceivable.

Factors that determine the crystallinity include crystallite size and crystal strain. When the crystallite size is as large as 1 $\mu$m or more, polish scratches tend to occur. Also, even when the crystallite size is small, polish scratches may occur if particles having no crystal strain are used. However, some cerium oxide particles have too low a crystallinity to cause any polish scratches, but are not able to effect high-rate polishing. Thus, cerium oxide particles which make it possible to prevent polish scratches and to effect high-rate polishing have a range of proper particle size and a proper degree of strain. Factors that determine the polishing rate include not only the crystallinity of particles stated above but also the active chemical nature inherent in cerium oxide.

Even with use of silica particles having a higher particle hardness than the cerium oxide particles, silica slurries have a much lower polishing rate than the cerium oxide slurry. This indicates that the cerium oxide slurry has a stronger chemical factor in the chemomechanical polishing. The surface of $SiO_2$ insulating film stands charged negatively in a solution having a hydrogen ion concentration of pH 3 or more. When polished with a slurry making use of cerium oxide particles standing charged positively, an inert film composed chiefly of cerium oxide is formed. This inert film can not be removed by washing with water, and is removed using a strongly acidic solution such as nitric acid. Simultaneously with the removal of the inert film by the use of an acid, the insulating layer is removed to an extent of 1,000 nm or more. The insulating film thus removed is a reactive layer formed when the inert film is formed. The inert film is also formed when the cerium oxide particles stand charged negatively. The degree of adhesion of the inert film to the insulating film depends on how far the particles are charged. For example, an inert film formed when the absolute negative value where the particles stand charged is great can be removed by washing with water or brush cleaning. That is, the degree of formation of the inert layer and reactive layer depends on the state of charging of particles. This phenomenon of formation of the inert film is not seen in silica slurries, and is a phenomenon inherent in the cerium oxide slurry. This phenomenon is one of the factors that determine the high-rate polishing. The cerium oxide particles scrape off these inert film and reactive layer. This phenomenon is the mechanical factor in the chemomechanical polishing. If particles have a low crystallinity, the reactive layer can not be removed, resulting in a low polishing rate. On the other hand, particles having a high crystallinity can remove the reactive layer with ease, and can quickly scrape off the reactive layer formed immediately after removal. Thus, the formation of reactive layers and the polishing with particles take place one after another, so that the polishing can be carried out at a high rate.

As a method for examining the state of charging of particles in the slurry, the zeta potential measurement is available. To describe its specific principle, the cerium oxide slurry is put in a measuring cell like the one provided with platinum electrodes on both sides, and a voltage is applied to the both electrodes. Cerium oxide particles having come to have charges upon application of the voltage move toward the electrode side having a polarity reverse to that of the charges. The mobility thereof is determined, and the zeta potential of particles can be determined from a known expression of the relationship between mobility and zeta potential. To form the inert film and reactive layer, the cerium oxide slurry may preferably have a zeta potential of −100 mV or above. However, when particles are charged positively or, even though charged negatively, have an absolute value smaller than 10 mV, the inert film is formed so strongly that the polishing with optimum particles that do not cause polish scratches is impossible. Accordingly, the slurry may preferably have a zeta potential of from −100 mV to −10 mV.

Using the cerium oxide abrasive comprising the slurry prepared by dispersing the cerium oxide particles in the medium, an inert film that may prevent the polishing proceeding thereon may be formed only on the surface of one certain type of film and the other film may be polished selectively, whereby layers formed of two or more types of different films on the substrate can be polished.

The inert film that may prevent the polishing proceeding thereon may be formed only on the surface of one certain type of film among the layers formed of two or more types of different films on the substrate, and the film area where such an inert film has been formed, may serve as a stopper so that the other film may be polished selectively, whereby the layers formed as described above can be made smooth.

This polishing method utilizes the properties that the polishing barely proceeds on the surfaces of a certain interlayer insulating film and a certain interlayer smoothing film because an inert film comprised of abrasive particles or a reaction product of a polishing liquid composition with a film composition is formed on such surfaces. The inert film refers to a surface layer that may make the polishing rate lower than the film to be polished originally. When such a certain interlayer insulating film and interlayer smoothing film on which the inert film may be formed are used to form patterns of semiconductor chips, another interlayer film on which the polishing proceeds may be formed as its upper layer, whereby a global smoothness can be achieved using the lower layer film as a stopper.

Those comprised of such two or more types of different films formed on a substrate may include those in which the substrate is a semiconductor substrate and the layers formed thereon are an organic SOG (spin-on glass) film and an $SiO_2$ film formed by chemical vapor deposition or thermal oxidation, where the film on which the inert film is formed is the $SiO_2$ film and the film to be polished selectively is the organic SOG film.

The organic SOG film is a film formed by coating a coating solution obtained by, e.g., hydrolyzing an alkoxysilane and an alkylalkoxysilane in an organic solvent such as alcohol with addition of water and a catalyst, on a substrate by spin coating or the like, followed by heating to cause the coating to cure.

In such an insulating film, preferred is an insulating film in which the number of Si atoms originating from siloxane bonds and the number of C atoms originating from alkyl groups in the insulating film have the relationship of:

Number of C atoms/(number of Si atoms+number of C atoms)≧0.1.

On the organic SOG insulating film layer having been smoothed, a CVD-$SiO_2$ film and second-layer aluminum wiring are formed, and lower layer CVD-$SiO_2$ film and organic SOG insulating film are formed between the wiring and on the wiring, followed by polishing using the above cerium oxide slurry to thereby remove unevenness of the insulating film layer surface to provide a smooth face over the whole area of the semiconductor substrate. This process may be repeated a given number of times so that a semiconductor having the desired number of layers can be produced. In the process where the films formed of two or more types of films are polished to form the intended structure by utilizing this polishing method, the smoothing that utilizes the selective polishing can make the process simple and highly precise.

EXAMPLE 1

(Production 1 of cerium oxide particles)

2 kg of cerium carbonate hydrate was placed in a container made of platinum, followed by firing at 800° C. for 2 hours in air to obtain about 1 kg of a yellowish white powder. Phase identification of this powder was made by X-ray diffraction to confirm that it was cerium oxide. The fired powder had particle diameters of 30 to 100 μm. The particle surfaces of the fired powder were observed on a scanning electron microscope, where grain boundaries of cerium oxide were seen. Diameters of cerium oxide primary particles surrounded by the grain boundaries were measured to find that the median diameter and maximum diameter in their particle size distribution were 190 nm and 500 nm, respectively. Precision measurement by X-ray diffraction was made on the fired powder, and the results obtained were analyzed by the Rietvelt method (RIETAN-94) to find that the value of structural parameter X which represents primary-particle diameter was 0.080 and the value of structural parameter Y which represents an isotropic microstrain was 0.223. Using a jet mill, 1 kg of the cerium oxide powder was dry-process pulverized. The pulverized particles obtained were observed on a scanning electron microscope to find that large pulverization residue particles of from 1 μm to 3 μm diameter and pulverization residue particles of from 0.5 μm to 1 μm diameter were present in a mixed state in addition to small particles having the same size as primary-particle diameter. The pulverization residue particles were not agglomerates of primary particles. Precision measurement by X-ray diffraction was made on the pulverized particles, and the results obtained were analyzed by the Rietvelt method (RIETAN-94) to find that the value of structural parameter X which represents primary-particle diameter was 0.085 and the value of structural parameter Y which represents an isotropic microstrain was 0.264. As the result, there was almost no variation in primary-particle diameter caused by pulverization and also strains were introduced into particles as a result of pulverization. Measurement of specific surface area by the BET method also revealed that it was 10 $M^2/g$.

(Production 2 of cerium oxide particles)

2 kg of cerium carbonate hydrate was placed in a container made of platinum, followed by firing at 750° C. for 2 hours in air to obtain about 1 kg of a yellowish white powder. Phase identification of this powder was made by X-ray diffraction to confirm that it was cerium oxide. The fired powder had particle diameters of 30 to 100 μm. The particle surfaces of the fired powder were observed on a scanning electron microscope, where grain boundaries of cerium oxide were seen. Diameters of cerium oxide primary particles surrounded by the grain boundaries were measured to find that the median diameter and maximum diameter in their particle size distribution were 141 nm and 400 nm, respectively. Precision measurement by X-ray diffraction was made on the fired powder, and the results obtained were analyzed by the Rietvelt method (RIETAN-94) to find that the value of structural parameter X which represents primary-particle diameter was 0.101 and the value of structural parameter Y which represents an isotropic microstrain was 0.223. Using a jet mill, 1 kg of the cerium oxide powder was dry-process pulverized. The pulverized particles obtained were observed on a scanning electron microscope to find that large pulverization residue particles of from 1 μm to 3 μm diameter and pulverization residue particles of from 0.5 μm to 1 μm diameter were present in a mixed state in addition to small particles having the same size as primary-particle diameter. The pulverization residue particles were not agglomerates of primary particles. Precision measurement by X-ray diffraction was made on the pulverized particles, and the results obtained were analyzed by the Rietvelt method (RIETAN-94) to find that the value of structural parameter X which represents primary-particle diameter was 0.104 and the value of structural parameter Y which represents an isotropic microstrain was 0.315. As the result, there was almost no variation in primary-particle diameter caused by pulverization and also strains were introduced into particles as a result of pulverization. Measurement of specific surface area by the BET method also revealed that it was 16 $m^2/g$.

(Production of cerium oxide slurry)

1 kg of the cerium oxide particles obtained in the above production 1 or 2, 23 g of an aqueous ammonium polyacrylate solution (40% by weight) and 8,977 g of deionized water were mixed, and the mixture formed was subjected to ultrasonic dispersion for 10 minutes with stirring. The slurries thus obtained were filtered with a 1 μm filter, followed by further addition of deionized water to obtain a 3% by weight abrasive. The slurries had a pH of 8.3.

Particle size distribution of slurry particles was examined by laser diffraction (measured with a measuring apparatus: MASTER SIZER MICROPLUS, manufactured by Malvern Instruments Ltd.; refractive index: 1.9285; light source: He—Ne laser; absorption: 0) to find that the median diameter was 200 nm for each slurry. With regard to maximum particle diameter, particles of 780 nm or larger were in a content of 0% by volume.

To examine dispersibility of the slurries and charges of the slurry particles, the zeta potentials of the slurries were measured. Each cerium oxide slurry was placed in a measuring cell provided with platinum electrodes on both sides, and a voltage of 10 V was applied to both electrodes. Slurry particles having come to have charges upon application of the voltage move toward the electrode side having a polarity reverse to that of the charges. The zeta potential of particles can be determined by determining their mobility. As a result of the measurement of zeta potential, it was confirmed that the particles in each slurry were charged negatively, and showed a large absolute value of −50 mV or −63 mV, respectively, having a good dispersibility.

(Polishing of insulating film layer)

Silicon wafers on which $SiO_2$ insulating films produced by TEOS plasma-assisted CVD were formed were each set on a holder provided with a suction pad stuck thereon for attaching the substrate to be held, and the holder was placed, with its insulating film side down, on a platen on which a polishing pad made of porous urethane resin was stuck. A weight was further placed thereon so as to provide a processing load of 300 $g/cm^2$.

The platen was rotated at 30 rpm for 2 minutes to polish the insulating film while dropwise adding the above cerium oxide slurry (solid content: 3% by weight) onto the platen at a rate of 50 ml/minute. After the polishing was completed, the wafer was detached from the holder and then well rinsed in running water, followed by further cleaning for 20 minutes by an ultrasonic cleaner. After the cleaning was completed, the wafer was set on a spin dryer to remove drops of water, followed by drying for 10 minutes by a 120° C. dryer.

Changes in layer thickness before and after the polishing were measured with a light-interference type layer thickness measuring device. As a result, it was found that as a result of this polishing the insulating films were abraded by 600 nm and 580 nm (polishing rate: 300 nm/minute, 290 nm/minute), respectively, and each wafer was in a uniform thickness over its whole area. The surfaces of the insulating films were also observed using an optical microscope, where no evident scratches were seen.

EXAMPLE 2

(Production of cerium oxide particles)

2 kg of cerium carbonate hydrate was placed in a container made of platinum, followed by firing at 700° C. for 2 hours in air to obtain about 1 kg of a yellowish white powder. Phase identification of this powder was made by Xray diffraction to confirm that it was cerium oxide. The fired powder had particle diameters of 30 to 100 $\mu$m. The particle surfaces of the fired powder were observed on a scanning electron microscope, where grain boundaries of cerium oxide were seen. Diameters of cerium oxide primary particles surrounded by the grain boundaries were measured to find that the median diameter and maximum diameter in their particle size distribution were 50 nm and 100 nm, respectively. Precision measurement by X-ray diffraction was made on the fired powder, and the results obtained were analyzed by the Rietvelt method (RIETAN-94) to find that the value of structural parameter X which represents primary-particle diameter was 0.300 and the value of structural parameter Y which represents an isotropic microstrain was 0.350.

Using a jet mill, 1 kg of the cerium oxide powder was dry-process pulverized. The pulverized particles obtained were observed on a scanning electron microscope to find that large pulverization residue particles of from 2 $\mu$m to 4 $\mu$m diameter and pulverization residue particles of from 0.5 $\mu$m to 1.2 $\mu$m diameter were present in a mixed state in addition to small particles having the same size as primary-particle diameter. The pulverization residue particles were not agglomerates of primary particles. Precision measurement by X-ray diffraction was made on the pulverized particles, and the results obtained were analyzed by the Rietvelt method (RIETAN-94) to find that the value of structural parameter X which represents primary-particle diameter was 0.302 and the value of structural parameter Y which represents an isotropic microstrain was 0.412. As the result, there was almost no variation in primary-particle diameter to be caused by pulverization and also strains were introduced into particles as a result of pulverization. Measurement of specific surface area by the BET method also revealed that it was 40 m$^2$/g.

(Production of cerium oxide slurry)

1 kg of the cerium oxide particles produced in the above, 23 g of an aqueous ammonium polyacrylate solution (40% by weight) and 8,977 g of deionized water were mixed, and the mixture formed was subjected to ultrasonic dispersion for 10 minutes with stirring. The slurry thus obtained was filtered with a 2 $\mu$m filter, followed by further addition of deionized water to obtain a 3% by weight abrasive. The slurry had a pH of 8.0. Particle size distribution of slurry particles was examined by laser diffraction (measuring apparatus: MASTER SIZER MICROPLUS; refractive index: 1.9285) to find that the median diameter was 510 nm. With regard to maximum particle diameter, particles of 1,430 nm or larger were in a content of 0%.

To examine dispersibility of the slurry and charges of the slurry particles, the zeta potential of the slurry was measured. The cerium oxide slurry was put in a measuring cell provided with platinum electrodes on both sides, and a voltage of 10 V was applied to both electrodes. Slurry particles having come to have charges upon application of the voltage move toward the electrode side having a polarity reverse to that of the charges. The zeta potential of particles can be determined by determining their mobility. As a result of the measurement of zeta potential, it was confirmed that the particles were charged negatively, and showed a large absolute value of −64 mV, having a good dispersibility.

(Polishing of insulating film layer)

A silicon wafer on which an SiO$_2$ insulating film produced by TEOS plasma-assisted CVD was formed was set on a holder provided with a suction pad stuck thereon for attaching the substrate to be held, and the holder was placed, with its insulating film side down, on a platen on which a polishing pad made of porous urethane resin was stuck. A weight was further placed thereon so as to provide a processing load of 300 g/cm$^2$.

The platen was rotated at 30 rpm for 2 minutes to polish the insulating film while dropwise adding the above cerium oxide slurry (solid content: 3% by weight) onto the platen at a rate of 35 ml/minute. After the polishing was completed, the wafer was detached from the holder and then well rinsed in running water, followed by further cleaning for 20 minutes using an ultrasonic cleaner. After the cleaning was completed, the wafer was set on a spin dryer to remove drops of water, followed by drying for 10 minutes using a 120° C. dryer. Changes in layer thickness before and after the polishing were measured with a light-interference type layer thickness measuring device. As the result, it was found that as a result of this polishing the insulating film was abraded by 740 nm (polishing rate: 370 nm/minute) and the wafer was in a uniform thickness over its whole area. The surface of the insulating film was also observed using an optical microscope, where no evident scratches were seen.

EXAMPLE 3

(Production of cerium oxide particles)

2 kg of cerium carbonate hydrate was placed in a container made of platinum, followed by firing at 800° C. for 2 hours in air to obtain about 1 kg of a yellowish white powder. Phase identification of this powder was made by Xray diffraction to confirm that it was cerium oxide. The fired powder had particle diameters of 30 to 100 $\mu$m. The particle surfaces of the fired powder were observed on a scanning electron microscope, where grain boundaries of cerium oxide were seen. Diameters of cerium oxide primary particles surrounded by the grain boundaries were measured to find that the median diameter and maximum diameter in their particle size distribution were 190 nm and 500 nm, respectively. Precision measurement by X-ray diffraction was made on the fired powder, and the results obtained were analyzed by the Rietvelt method (RIETAN-94) to find that the value of structural parameter X which represents primary-particle diameter was 0.080 and the value of structural parameter Y which represents an isotropic microstrain was 0.223.

Using a bead mill, 1 kg of the cerium oxide powder was wet-process pulverized. A fluid containing the pulverized particles obtained was dried, and the dried particles were ball-mill pulverized. The resultant pulverized particles were observed on a scanning electron microscope to find that they had been pulverized to particles having the same size as primary-particle diameter and no large pulverization residue particles were seen. Precision measurement by X-ray diffraction was made on the pulverized particles, and the results obtained were analyzed by the Rietvelt method (RIETAN-94) to find that the value of structural parameter X which represents primary-particle diameter was 0.085 and the value of structural parameter Y which represents an isotropic microstrain was 0.300. As a result, there was almost no variation in primary-particle diameter caused by pulverization and also strains were introduced into particles as a result of pulverization. Measurement of specific surface area by the BET method also revealed that it was 10 m$^2$/g.

(Production of cerium oxide slurry)

1 kg of the cerium oxide particles produced in the above, 23 g of an aqueous ammonium polyacrylate solution (40% by weight) and 8,977 g of deionized water were mixed, and the mixture formed was subjected to ultrasonic dispersion for 10 minutes with stirring. The slurry thus obtained was filtered with a 1 μm filter, followed by further addition of deionized water to obtain a 3% by weight abrasive. The slurry had a pH of 8.3. Particle size distribution of slurry particles was examined by laser diffraction (measuring apparatus: MASTER SIZER MICROPLUS; refractive index: 1.9285) to find that the median diameter was 290 nm. With regard to maximum particle diameter, particles of 780 nm or larger were in a content of 0%.

To examine dispersibility of the slurry and charges of the slurry particles, the zeta potential of the slurry was measured. The cerium oxide slurry was put in a measuring cell provided with platinum electrodes on both sides, and a voltage of 10 V was applied to both electrodes. Slurry particles having come to have charges upon application of the voltage move toward the electrode side having a polarity reverse to that of the charges. The zeta potential of particles can be determined by determining their mobility. As a result of the measurement of zeta potential, it was confirmed that the particles were charged negatively, and showed a large absolute value of −50 mV, having a good dispersibility.

(Polishing of insulating film layer)

A silicon wafer on which an SiO$_2$ insulating film produced by TEOS plasma-assisted CVD was formed was set on a holder provided with a suction pad stuck thereon for attaching the substrate to be held, and the holder was placed, with its insulating film side down, on a platen on which a polishing pad made of porous urethane resin was stuck. A weight was further placed thereon so as to provide a processing load of 300 g/cm$^2$. The platen was rotated at 30 rpm for 2 minutes to polish the insulating film while dropwise adding the above cerium oxide slurry (solid content: 3% by weight) onto the platen at a rate of 35 ml/minute.

After the polishing was completed, the wafer was detached from the holder and then well rinsed in running water, followed by further cleaning for 20 minutes using an ultrasonic cleaner. After the cleaning was completed, the wafer was set on a spin dryer to remove drops of water, followed by drying for 10 minutes using a 120° C. dryer. Changes in layer thickness before and after the polishing were measured with a light-interference type layer thickness measuring device. As a result, it was found that as a result of this polishing the insulating film was abraded by 560 nm (polishing rate: 280 nm/minute) and the wafer was in a uniform thickness over its whole area. The surface of the insulating film was also observed using an optical microscope, where no evident scratches were seen.

EXAMPLE 4

(Production of cerium oxide particles)

2 kg of cerium carbonate hydrate was placed in a container made of platinum, followed by firing at 700° C. for 2 hours in air to obtain about 1 kg of a yellowish white powder. Phase identification of this powder was made by Xray diffraction to confirm that it was cerium oxide. The fired powder had particle diameters of 30 to 100 μm. The particle surfaces of the fired powder were observed on a scanning electron microscope, where grain boundaries of cerium oxide were seen. Diameters of cerium oxide primary particles surrounded by the grain boundaries were measured to find that the median diameter and maximum diameter in their particle size distribution were 50 nm and 100 nm, respectively. Precision measurement by X-ray diffraction was made on the fired powder, and the results obtained were analyzed by the Rietvelt method (RIETAN-94) to find that the value of structural parameter X which represents primary-particle diameter was 0.300 and the value of structural parameter Y which represents an isotropic microstrain was 0.350.

Using a bead mill, 1 kg of the cerium oxide powder was wet-process pulverized. A fluid containing the pulverized particles obtained was dried, and the dried particles were ball-mill pulverized. The resultant pulverized particles were observed on a scanning electron microscope to find that they had been pulverized to particles having the same size as primary-particle diameter and no large pulverization residue particles were seen. Precision measurement by X-ray diffraction was made on the pulverized particles, and the results obtained were analyzed by the Rietvelt method (RIETAN-94) to find that the value of structural parameter X which represents primary-particle diameter was 0.302 and the value of structural parameter Y which represents an isotropic microstrain was 0.450. As a result, there was almost no variation in primary-particle diameter caused by pulverization and also strains were introduced into particles as a result of pulverization. Measurement of specific surface area by the BET method also revealed that it was 40 m$^2$/g.

(Production of cerium oxide slurry)

1 kg of the cerium oxide particles produced in the above, 23 g of an aqueous ammonium polyacrylate solution (40% by weight) and 8,977 g of deionized water were mixed, and the mixture formed was subjected to ultrasonic dispersion for 10 minutes with stirring. The slurry thus obtained was filtered with a 1 μm filter, followed by further addition of deionized water to obtain a 3% by weight abrasive. The slurry had a pH of 8.5. Particle size distribution of slurry particles was examined by laser diffraction (measuring apparatus: MASTER SIZER MICROPLUS; refractive index: 1.9285) to find that the median diameter was 290 nm. With regard to maximum particle diameter, particles of 780 nm or larger were in a content of 0%.

To examine dispersibility of the slurry and charges of the slurry particles, the zeta potential of the slurry was measured. The cerium oxide slurry was put in a measuring cell provided with platinum electrodes on both sides, and a voltage of 10 V was applied to both electrodes. Slurry particles having come to have charges upon application of the voltage move toward the electrode side having a polarity reverse to that of the charges. The zeta potential of particles can be determined by determining their mobility. As a result of the measurement of zeta potential, it was confirmed that the particles were charged negatively, and showed a large absolute value of -65 mV, having a good dispersibility.

(Polishing of insulating film layer)

A silicon wafer on which an SiO$_2$ insulating film produced by TEOS plasma-assisted CVD was formed was set on a holder provided with a suction pad stuck thereon for attaching the substrate to be held, and the holder was placed, with its insulating film side down, on a platen on which a polishing pad made of porous urethane resin was stuck. A weight was further placed thereon so as to provide a processing load of 300 g/cm². The platen was rotated at 30 rpm for 2 minutes to polish the insulating film while dropwise adding the above cerium oxide slurry (solid content: 3% by weight) onto the platen at a rate of 35 ml/minute.

After the polishing was completed, the wafer was detached from the holder and then well rinsed in running water, followed by further cleaning for 20 minutes using an ultrasonic cleaner. After the cleaning was completed, the wafer was set on a spin dryer to remove drops of water, followed by drying for 10 minutes using a 120° C. dryer. Changes in layer thickness before and after the polishing were measured with a light-interference type layer thickness measuring device. As the result, it was found that as a result of this polishing the insulating film was abraded by 400 nm (polishing rate: 200 nm/minute) and the wafer was in a uniform thickness over its whole area. The surface of the insulating film was also observed using an optical microscope, where no evident scratches were seen.

COMPARATIVE EXAMPLE

A silicon wafer on which an $SiO_2$ insulating film produced by TEOS plasma-assisted CVD was formed in the same manner as in Examples, was polished using a silica slurry. Silica slurry is one having a pH of 10.3 and containing 12.5% by weight of $SiO_2$ particles. The polishing was carried out under the same conditions as in Examples. As a result, scratches caused by polishing were not seen, and the insulating film layer was polished uniformly, but was abraded only by 150 nm as a result of polishing for 2 minutes (polishing rate: 75 nm/minute).

Possibility of Industrial Application

As described above, the abrasive according to the present invention can polish the surfaces of polish objects such as $SiO_2$ insulating films at a high rate without causing scratches, and is especially suited for use in the polishing of given substrates such as semiconductor chips.

What is claimed is:

1. A cerium oxide abrasive comprising a slurry containing cerium oxide particles comprising plural primary particles wherein:

said primary particles consist essentially of cerium oxide;

said primary particles have a median diameter of from 30 nm to 250 nm;

said cerium oxide particles have a median diameter of from 150 nm to 600 nm; and said cerium oxide particles are obtained by pulverizing cerium oxide obtained by firing cerium carbonate, wherein said primary particles have a structural parameter Y, representing an isotropic microstrain in analysis by the powder X-ray Rietvelt method (RIETAN-94), of from 0.01 to 0.70.

* * * * *

UNITED STATES PATENT AND TRADEMARK OFFICE
CERTIFICATE OF CORRECTION

PATENT NO. : 6,221,118 B1
DATED : April 24, 2001
INVENTOR(S) : Masato Yoshida; Toranosuke Ashizawa; Hiroki Terazaki; Yasushi Kurata; Jun Matsuzawa; Kiyohito Tanno; and Yuuto Ootuki It is certified that error appears in the above-identified patent and that said Letters Patent is hereby corrected as shown below:

<u>Title page,</u>
Under item [30] Foreign Application Priority Data, add -- Sep. 30, 1996 (JP) ...............8-259138 --.

Signed and Sealed this

Thirteenth Day of November, 2001

*Attest:*

*Attesting Officer*

NICHOLAS P. GODICI
*Acting Director of the United States Patent and Trademark Office*